(12) United States Patent
Chen et al.

(10) Patent No.: US 8,269,233 B2
(45) Date of Patent: Sep. 18, 2012

(54) VERTICAL ACLED STRUCTURE

(75) Inventors: Wei-Yo Chen, Hsinchu (TW); Yen-Wen Chen, Hsinchu (TW); Shu-Ting Hsu, Hsinchu (TW); Tsung Xian Lee, Hsinchu (TW)

(73) Assignee: Epistar Corporation (TW)

( * ) Notice: Subject to any disclaimer, the term of this patent is extended or adjusted under 35 U.S.C. 154(b) by 37 days.

(21) Appl. No.: 12/588,745

(22) Filed: Oct. 27, 2009

(65) Prior Publication Data
US 2010/0109028 A1  May 6, 2010

(30) Foreign Application Priority Data
Oct. 27, 2008  (TW) .................. 97141302 A

(51) Int. Cl.
*H01L 29/201* (2006.01)
*H01L 33/00* (2010.01)
*H01L 29/18* (2006.01)
*H01L 23/48* (2006.01)
*H01L 23/52* (2006.01)
*H01L 29/40* (2006.01)

(52) U.S. Cl. ............... 257/90; 257/88; 257/95; 257/98; 257/99; 257/103; 257/777; 257/778; 257/E33.023; 257/E33.044; 257/E33.057; 257/E33.058; 257/E33.061

(58) Field of Classification Search .................... None
See application file for complete search history.

(56) References Cited

U.S. PATENT DOCUMENTS

| 5,309,001 A * | 5/1994 | Watanabe et al. | 257/99 |
| 5,578,839 A * | 11/1996 | Nakamura et al. | 257/96 |
| 6,229,160 B1 * | 5/2001 | Krames et al. | 257/94 |
| 2002/0070681 A1 * | 6/2002 | Shimizu et al. | 315/246 |
| 2002/0123164 A1 * | 9/2002 | Slater et al. | 438/39 |
| 2002/0167015 A1 * | 11/2002 | Okazaki | 257/79 |
| 2004/0075399 A1 * | 4/2004 | Hall | 315/291 |
| 2007/0069223 A1 * | 3/2007 | Chen et al. | 257/88 |
| 2009/0140272 A1 * | 6/2009 | Beeson et al. | 257/89 |

FOREIGN PATENT DOCUMENTS

| CN | 2454905 Y | 9/2000 |
| KR | 1020100016901 A | 2/2010 |

* cited by examiner

*Primary Examiner* — Hoang-Quan Ho
(74) *Attorney, Agent, or Firm* — Bacon & Thomas, PLLC

(57) ABSTRACT

This application related to an opto-electrical device, comprising a first ACLED having a first n-type semiconductor layer, a first light emitting layer, a first p-type semiconductor layer, a first p-type electrode and a first n-type electrode; a second ACLED having a second n-type semiconductor layer, a second light emitting layer, a second p-type semiconductor layer, a second p-type electrode and a second n-type electrode, wherein each of the first ACLED and the second ACLED are vertical stack structure and is connected in anti-parallel manner.

18 Claims, 4 Drawing Sheets

VERTICAL ACLED STRUCTURE

REFERENCE TO RELATED APPLICATION

This application claims the right of priority based on TW application Ser. No. 097141302, filed Oct. 27, 2008, entitled "Vertical ACLED", and the contents of which are incorporated herein by reference.

BACKGROUND

1. Technical Field

This application related to a structure of ACLED, especially related to a vertical stack ACLED structure.

2. Description of the Related Art

The light-emitting diodes (LEDs) of the solid-state lighting elements have the characteristics of low power consumption, low heat generation, long operational life, shockproof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

Generally speaking, the conventional LED is driven by direct current (DC). An AC-DC inverter is required to invert DC to AC. Since the inverter has large volume and heavy weight, the cost is added and the power is loss during inverting. Therefore, it is difficult for LED to compete with the existing light source mainly because of the price concern.

The ACLED can solve the problems mentioned above. It can decrease the volume and weight of LED, extend to more applications, decrease the cost in inverter element, and decrease the 15~30% power loss of conventional DC-AC in inverting so the light efficiency of the whole LED is increased.

Nevertheless, the ACLEDs normally keep the growth substrate such as sapphire to form an anti-parallel connection structure in horizontal orientation, so the size is as twice as that of the conventional single chip. Accordingly, the space and cost is wasted.

SUMMARY

This application relates to an opto-electrical device comprising a first ACLED having a first n-type semiconductor layer, a first light emitting layer, a first p-type semiconductor layer, a first p-type electrode and a first n-type electrode; a second ACLED having a second n-type semiconductor layer, a second light emitting layer, a second p-type semiconductor layer, a second p-type electrode and a second n-type electrode, wherein each of the first ACLED and the second ACLED are vertical stack structure and is connected in anti-parallel manner.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
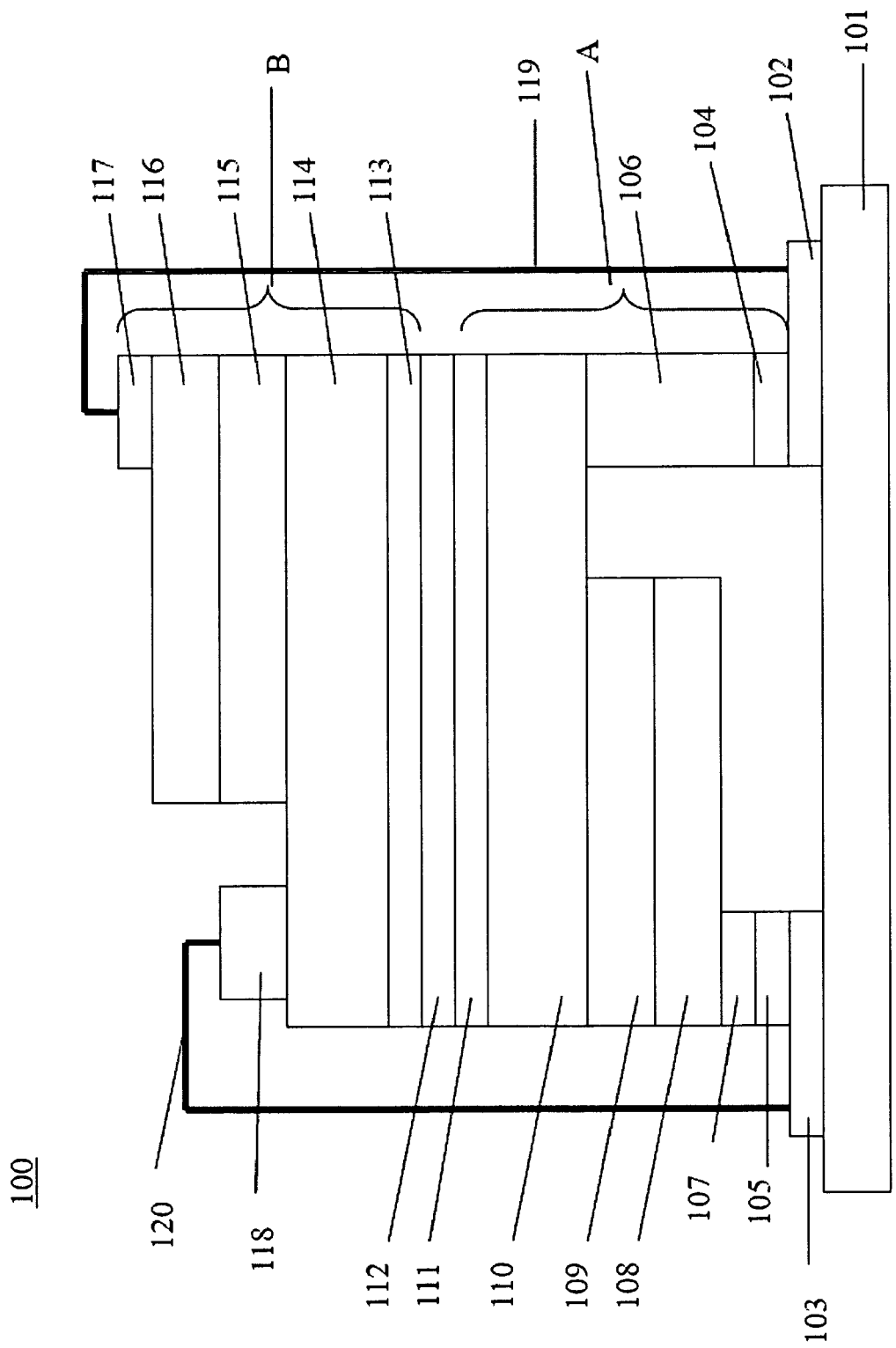
FIG. 1 illustrates a cross-sectional view of the vertical stack ACLED structure in accordance with one embodiment of the present application.

Reference is made in detail to the preferred embodiments of the present application, examples of which are illustrated in the accompanying drawings. Wherever possible, the same reference numbers are used in the drawings and the description to refer to the same or like parts.

This application relates to a structure of ACLED, especially relates to a vertical stack ACLED structure. This application connects respective p-type and n-type electrode of at least two ACLEDs which emitting light with the same or different wavelength in anti-parallel manner to form a vertical stack ACLED structure by wafer bonding, chip form bonding or flip-chip bonding in wafer or chip level.

The vertical stack ACLED structure of this application can decrease the area occupied by the chip. The ACLED structure in the same space can emit light under different voltage phase when the ACLEDs are connected in anti-parallel manner by wafer bonding, chip form bonding or flip-chip bonding.

This application can be used for white light emitting device by combining phosphors and ACLEDs having different wavelength. Besides, the phosphor consumed in the device of the present application is less than that used in the conventional LEDs connected in anti-parallel manner horizontally by coating the phosphor with one unit of the area under the same light emitting area.

FIG. 1 illustrates a cross-sectional view of the vertical stack ACLED structure in accordance with the first embodiment of the present application. The structure includes a submount 101, a bonding layer 112, two light emitting diodes A, B and two wires 119, 120. The bonding layer 112 can be a transparent layer, and the material can be conductive material such as ITO, or insulating material such as the organic plastic material, ex: BCB, SINR, or HT250.

The first light emitting diodes A contains a first substrate 111, a first n-type semiconductor layer 110, a first light emitting layer 109, and a first p-type semiconductor layer 108 formed on the first substrate 111 subsequently. The material of the first n-type semiconductor layer 110, the first light emitting layer 109 and the first p-type semiconductor layer 108 contains one or more elements selected from the group consisting of Ga, Al, In, As, P, N and Si.

A first p-type electrode 107 is formed on the first p-type semiconductor layer 108; a first n-type electrode 106 is formed on the first n-type semiconductor layer 110. The first p-type electrode 107 is connected to a p-type electrode 103 on the submount 101 by a first solder 105; the first n-type electrode 106 is connected to a n-type electrode 102 on the submount 101 by a second solder 104.

The second light emitting diodes B contains a second substrate 113, a second n-type semiconductor layer 114, a second light emitting layer 115 and a second p-type semiconductor layer 116 formed on the second substrate 113 subsequently.

The material of the second n-type semiconductor layer 114, the second light emitting layer 115 and the second p-type semiconductor layer 116 contains one or more elements selected from the group consisting of Ga, Al, In, As, P, N and Si.

A second p-type electrode 117 is formed on the second p-type semiconductor layer 116; a second n-type electrode 118 is formed on the second n-type semiconductor layer 114. The material of the first substrate 111 and the second substrate 113 can be sapphire, SiC, ZnO or GaN.

The first substrate 111 of the first light emitting diode A and the second substrate 113 of the second light emitting diode B is connected by a bonding layer 112. The second p-type electrode 117 of the second light emitting diode B is connected to a n-type electrode 102 on the submount 101 by a first wire 119; the second n-type electrode 118 of the second light emitting diode B is connected to a p-type electrode 103 on the submount 101 by a second wire 120. The light emitting diode A and the light emitting diode B are connected in anti-parallel manner to form a vertical stack structure by wafer bonding, chip form bonding or flip-chip bonding.

Figure 2:
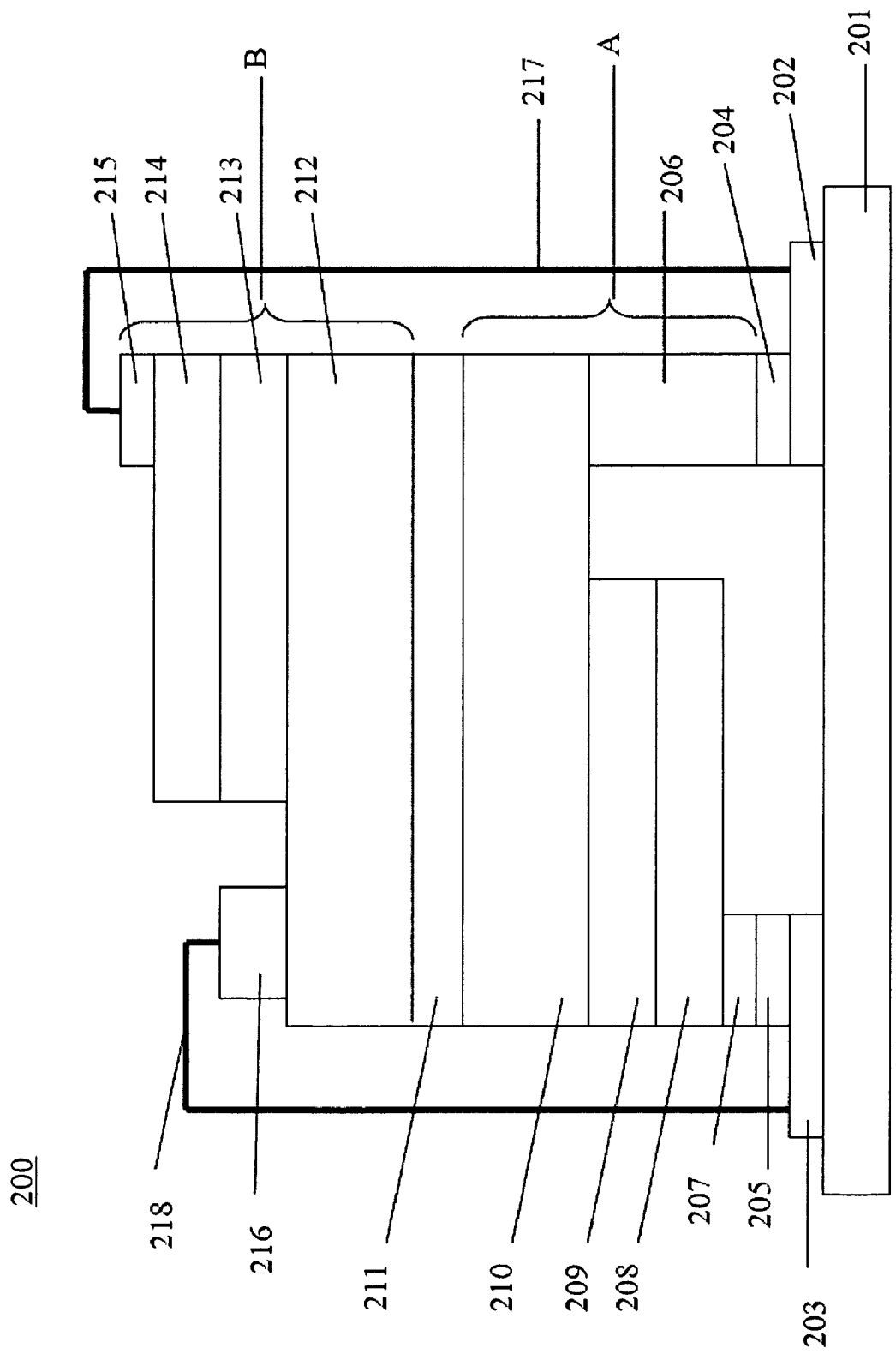
FIG. 2 illustrates a cross-sectional view of the vertical stack ACLED structure in accordance with one embodiment of the present application.

FIG. 2 illustrates a cross-sectional view of the vertical stack ACLED structure in accordance with a second embodiment of the present application. The structure includes a submount 201, a bonding layer 211, two light emitting diodes A, B and two wires 217, 218. The bonding layer 211 can be a transparent layer, and the material can be conductive material such as ITO, or insulating material such as the organic plastic material, ex: BCB, SINR, or HT250.

The first light emitting diodes A contains a first n-type semiconductor layer 210, a first light emitting layer 209 and a first p-type semiconductor layer 208. The material of the first n-type semiconductor layer 210, the first light emitting layer 209 and the first p-type semiconductor layer 208 contains one or more elements selected from the group consisting of Ga, Al, In, As, P, N and Si.

A first p-type electrode 207 is formed on the first p-type semiconductor layer 208; a first n-type electrode 206 is formed on the first n-type semiconductor layer 210. The first p-type electrode 207 is connected to a p-type electrode 203 on the submount 201 by a first solder 205; the first n-type electrode 206 is connected to a n-type electrode 202 on the submount 201 by a second solder 204.

The second light emitting diodes B contains a second n-type semiconductor layer 212, a second light emitting layer 213 and a second p-type semiconductor layer 214. The material of the second n-type semiconductor layer 212, the second light emitting layer 213 and the second p-type semiconductor layer 214 contains one or more elements selected from the group consisting of Ga, Al, In, As, P, N and Si.

A second p-type electrode 215 is formed on the second p-type semiconductor layer 214; a second n-type electrode 216 is formed on the second n-type semiconductor layer 212.

The growth substrates of the light emitting diode A and the light emitting diode B are removed to reduce thermal resistance ($R_{th}$). The light emitting diode A and the light emitting diode B are connected by the bonding layer 211 to connect the first n-type semiconductor layer 210 and the second n-type semiconductor layer 212.

Besides, the second p-type electrode 215 of the second light emitting diode B is connected to the n-type electrode 202 on the submount 201 by a first wire 217; the second n-type electrode 216 of the second light emitting diode B is connected to the p-type electrode 203 on the submount 201 by a second wire 218. The light emitting diode A and the light emitting diode B are connected in anti-parallel manner to form a vertical stack structure by wafer bonding, chip form bonding or flip-chip bonding.

Figure 3:
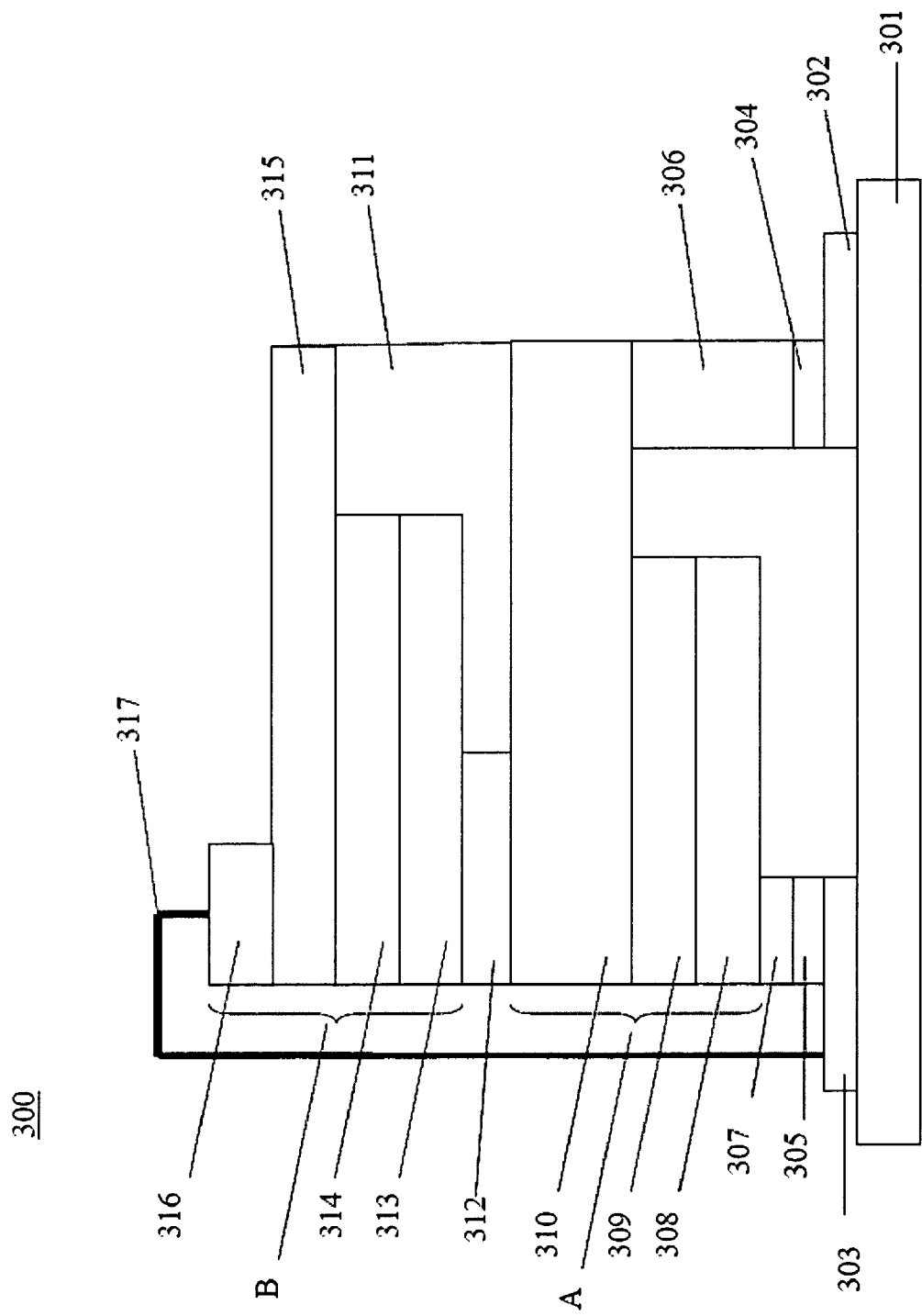
FIG. 3 illustrates a cross-sectional view of the vertical stack ACLED structure in accordance with one embodiment of the present application.

FIG. 3 illustrates a cross-sectional view of the vertical stack ACLED structure in accordance with the third embodiment of the present application. The structure includes a submount 301, a bonding layer 311, two light emitting diodes A, B and a wire 317. The bonding later 311 can be a transparent layer, and the material can be conductive material such as ITO, or insulating material such as the organic plastic material, ex: BAB, SINR, or HT250.

The first light emitting diodes A contains a first n-type semiconductor layer 310, a first light emitting layer 309, and a first p-type semiconductor layer 308. The material of the first n-type semiconductor layer 310, the first light emitting layer 309, and the first p-type semiconductor layer 308 contains one or more elements selected from the group consisting of Ga, Al, In, As, P, N and Si.

A first p-type electrode 307 is formed on the first p-type semiconductor layer 308; a first n-type electrode 306 is formed on the first n-type semiconductor layer 310. The first p-type electrode 307 is connected to a p-type electrode 303 on the submount 301 by a first solder 305; the first n-type electrode 306 is connected to an n-type electrode 302 on the submount 301 by a second solder 304.

The second light emitting diodes B contains a second n-type semiconductor layer 315, a second light emitting layer 314, and a second p-type semiconductor layer 313. The material of the second n-type semiconductor layer 315, the second light emitting layer 314 and the second p-type semiconductor layer 313 contains one or more elements selected from the group consisting of Ga, Al, In, As, P, N and Si.

A second p-type electrode 312 is formed on the second p-type semiconductor layer 313; a second n-type electrode 316 is formed on the second n-type semiconductor layer 315.

The growth substrates of the light emitting diode A and the light emitting diode B are removed. The light emitting diode A and the light emitting diode B are connected to a bonding layer 311 to connect the first n-type semiconductor layer 310 and the second n-type semiconductor layer 313.

The second n-type electrode 316 of the second light emitting diode B is connected to the p-type electrode 303 on the submount 301 by the wire 317 to electrically connect the light emitting diode A and the light emitting diode B wherein the light emitting diode A and the light emitting diode B are connected in anti-parallel manner to form a vertical stack structure by wafer bonding, chip form bonding or flip-chip bonding.

Figure 4:
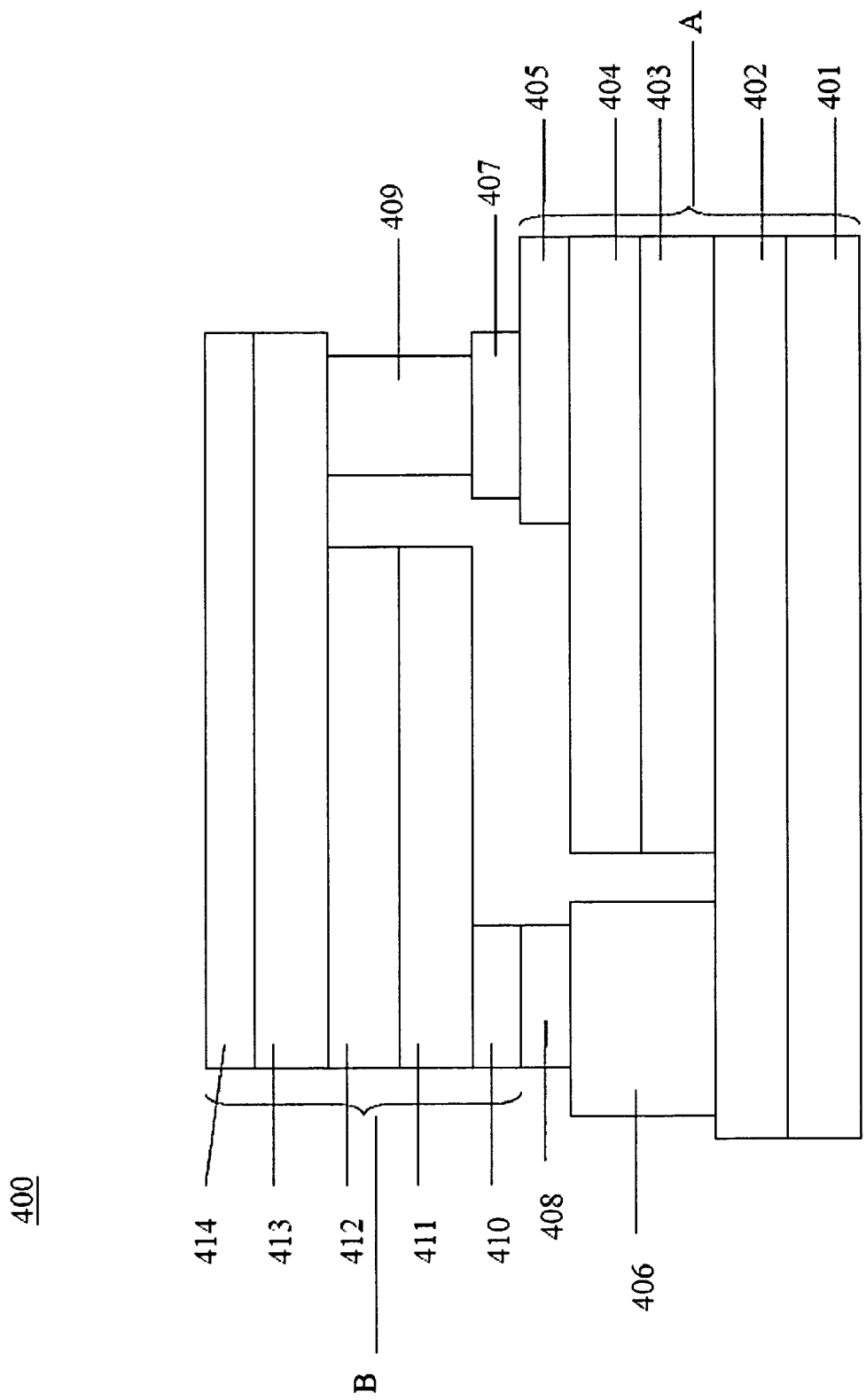
FIG. 4 illustrates a cross-sectional view of the vertical stack ACLED structure in accordance with one embodiment of the present application.

FIG. 4 illustrates a cross-sectional view of the vertical stack ACLED structure in accordance with the fourth embodiment of the present application. The structure includes two light emitting diodes A, B connected in anti-parallel manner to form a vertical stack structure by a first solder layer 407 and a second solder layer 408.

The first light emitting diodes A contains a first n-type semiconductor layer 402, a first light emitting layer 403, and a first p-type semiconductor layer 404 formed on a first substrate 401 subsequently. The material of the first n-type semiconductor layer 402, the first light emitting layer 403 and the first p-type semiconductor layer 404 contains one or more elements selected from the group consisting of Ga, Al, In, As, P, N and Si. A first p-type electrode 405 is formed on the first p-type semiconductor layer 404; a first n-type electrode 406 is formed on the first n-type semiconductor layer 402.

The second light emitting diodes B contains a second n-type semiconductor layer 413, a second light emitting layer 412 and a second p-type semiconductor layer 411 formed on a second substrate 414 subsequently. The material of the second n-type semiconductor layer 413, the second light emitting layer 412 and the second p-type semiconductor layer 411 contains one or more elements selected from the group consisting of Ga, Al, In, As, P, N and Si. A second p-type electrode 410 is formed on the second p-type semiconductor layer 411; a second n-type electrode 409 is formed on the second n-type semiconductor layer 413. The material of the first substrate 401 can be sapphire, SiC, ZnO, GaN, AlN, Cu or Si. The material of the second substrate 414 can be sapphire, SiC, ZnO or GaN.

The light emitting diode A and the light emitting diode B are electrically connected while the first p-type electrode 405 and the second n-type electrode 409 are connected by the first solder layer 407 and the first n-type electrode 406 and the second p-type electrode 410 are connected by the second solder layer 410 in anti-parallel manner to form a vertical stack structure by wafer bonding, chip form bonding or flip-chip bonding.

The roughened structure or micro-nano structure can be formed on the n-type semiconductor layer or the p-type semiconductor layer of the light emitting diode A and/or the light emitting diode B in the above mentioned embodiments to increase the light extraction efficiency. The low refraction index material, porous material or particle scattering layer can also be added in the structures of the above mentioned embodiments to decrease the light limited inside the chip and increase the light extraction efficiency.

The phosphors can be covered on the light emitting diode B or between the light emitting diode A and the light emitting diode B in the above mentioned ACLED combination structures in the embodiments.

What is claimed is:

1. An opto-electrical device comprising:
a submount;
a first ACLED having a first n-type semiconductor layer, a first light emitting layer, a first p-type semiconductor layer, a first p-type electrode and a first n-type electrode; and
a second ACLED having a second n-type semiconductor layer, a second light emitting layer, a second p-type semiconductor layer, a second p-type electrode and a second n-type electrode, wherein the first ACLED and the second ACLED are stacked to form one vertical stack structure and connected in anti-parallel manner inside the device, and the first ACLED is bonded to the second ACLED or the submount in the form of flip-chip bonding, said device consisting of two electrodes for a power source.

2. The opto-electrical device according to claim 1, further comprising a bonding layer to connect the first ACLED and the second ACLED.

3. The opto-electrical device according to claim 2, wherein the material of the bonding layer is a transparent material.

4. The opto-electrical device according to claim 2, wherein the material of the bonding layer can be ITO, BCB, SINR or HT250.

5. The opto-electrical device according to claim 2, wherein the first ACLED further comprises a first substrate and the second ACLED further comprises a second substrate to connect to the bonding layer.

6. The opto-electrical device according to claim 5, wherein the material of the first substrate and the second substrate can be sapphire, SiC, ZnO, GaN, AlN, Cu or Si.

7. The opto-electrical device according to claim 2, wherein the bonding layer connects the first n-type semiconductor layer of the first ACLED and the second n-type semiconductor layer of the second ACLED.

8. The opto-electrical device according to claim 1, wherein the wavelength of the first ACLED is different from the wavelength of the second ACLED.

9. The opto-electrical device according to claim 1, wherein the material of the first n-type semiconductor layer, the first light emitting layer, and the first p-type semiconductor layer contains one or more elements selected from the group consisting of Ga, Al, In, As, P, N and Si.

10. The opto-electrical device according to claim 1, wherein the material of the second n-type semiconductor layer, the second light emitting layer and the second p-type semiconductor layer contains one or more elements selected from the group consisting of Ga, Al, In, As, P, N and Si.

11. The opto-electrical device according to claim 1, wherein the p-type electrode of the first ACLED is electrically connected to the n-type electrode of the second ACLED.

12. The opto-electrical device according to claim 1, wherein the n-type electrode of the first ACLED is electrically connected to the p-type electrode of the second ACLED.

13. The opto-electrical device according to claim 1, further comprising a wire to connect the n-type electrode of the first ACLED and the p-type electrode of the second ACLED.

14. The opto-electrical device according to claim 1, wherein the submount further comprising two solders to electrically connect the first p-type electrode and the first n-type electrode of the first ACLED to the submount separately.

15. The opto-electrical device according to claim 1, further comprising two solders to electrically connect the first p-type electrode of the first ACLED to the n-type electrode of the second ACLED and the first n-type electrode of the first ACLED to the second p-type electrode of the second ACLED separately.

16. The opto-electrical device according to claim 1, further comprising phosphors covered on the second ACLED or between the first and second ACLEDs.

17. The opto-electrical device according to claim 1, wherein the first ACLED and the second ACLED further comprises a roughened structure or a micro-nano structure.

18. The opto-electrical device according to claim 1, wherein the first ACLED and the second ACLED are flip chip bonded to each other.

* * * * *